(12) United States Patent
Rudolff et al.

(10) Patent No.: US 10,476,506 B2
(45) Date of Patent: Nov. 12, 2019

(54) COMMUNICATION INTERFACE WITH AUTOMATIC ADAPTATION OF THE LEVEL OF THE INPUT SIGNAL

(71) Applicant: Inside Secure, Meyreuil (FR)

(72) Inventors: Francois Rudolff, Aix en Provence (FR); Julien Roche, Arles (FR)

(73) Assignee: Wisekey Semiconductors, Meyreuil (FR)

( * ) Notice: Subject to any disclaimer, the term of this patent is extended or adjusted under 35 U.S.C. 154(b) by 0 days.

(21) Appl. No.: 15/307,775

(22) PCT Filed: Mar. 24, 2015

(86) PCT No.: PCT/FR2015/050732
§ 371 (c)(1),
(2) Date: May 2, 2018

(87) PCT Pub. No.: WO2015/166151
PCT Pub. Date: Nov. 5, 2015

(65) Prior Publication Data
US 2019/0222213 A1 Jul. 18, 2019

(30) Foreign Application Priority Data
Apr. 30, 2014 (FR) ...................................... 14 53923

(51) Int. Cl.
*H03K 19/0175* (2006.01)
*H03K 19/0185* (2006.01)
(Continued)

(52) U.S. Cl.
CPC ..... *H03K 19/018507* (2013.01); *G06F 1/305* (2013.01); *G11C 5/066* (2013.01);
(Continued)

(58) Field of Classification Search
None
See application file for complete search history.

(56) References Cited

U.S. PATENT DOCUMENTS 8,698,543 B1 4/2014 Dribinsky
2004/0027153 A1 2/2004 Satou et al.
(Continued)

FOREIGN PATENT DOCUMENTS

EP 0 471 399 A1 2/1992
EP 1 231 563 A1 8/2002

*Primary Examiner* — Anh Q Tran

(57) ABSTRACT

A communication interface comprises an input terminal (Rx) for receiving a logic signal from a remote interface (IF2); a logic level discriminator (12) coupled to the input terminal; a peak detector (14) connected to store the peak value of the signal at the input terminal; and a voltage follower (16) connected to the discriminator for providing an auxiliary supply voltage (Vdd2') based on the value provided by the peak detector. An electrostatic discharge (ESD) protection device is further provided, including a first diode (D1) and an RC-circuit forming the peak detector, connected in series between the input terminal (Rx) and a first power supply line (Vss1); a transistor (MN1) connected between the first power supply line (Vss1) and the input terminal (Rx) through the first diode (D1) or a second diode (D1'); and inverter (42) configured to turn on the transistor when the voltage across the capacitor of the RC-circuit is less than a threshold.

5 Claims, 3 Drawing Sheets

(51) Int. Cl.
*G06F 1/30* (2006.01)
*G11C 5/06* (2006.01)
*H04L 25/02* (2006.01)
*H01L 27/02* (2006.01)
*H03K 19/003* (2006.01)

(52) U.S. Cl.
CPC ... *H01L 27/0248* (2013.01); *H03K 19/00369* (2013.01); *H03K 19/00384* (2013.01); *H04L 25/0296* (2013.01)

(56) References Cited

U.S. PATENT DOCUMENTS

2005/0267728 A1  12/2005  Maher et al.
2008/0043390 A1  2/2008   Yoshitani et al.

COMMUNICATION INTERFACE WITH AUTOMATIC ADAPTATION OF THE LEVEL OF THE INPUT SIGNAL

CROSS REFERENCE TO RELATED APPLICATIONS

The present application claims priority under 35 U.S.C. § 365 to International Patent Application No. PCT/FR2015/050732 filed Mar. 24, 2015, which claims priority to French Patent Application No. 1453923 filed on Apr. 30, 2014, which are incorporated herein by reference in their entirety.

TECHNICAL FIELD

The invention relates to communication interfaces for interconnecting devices or individual circuits, in particular to bidirectional serial interfaces such as I2C, USB, IEEE 1394, HDMI, SWP, SPI, etc.

BACKGROUND

FIG. 1 schematically shows a configuration where two interfaces IF1 and IF2 are connected through a bidirectional serial link. The notations and definitions hereinafter are provided with reference to the interface IF1 or "local" interface, the interface IF2 being the "remote" interface. Any bidirectional serial link typically includes a receiver line Rx, a transmission line Tx and a ground line (not shown). According to the standards or protocols specifying the interfaces, other lines may be provided, such as a clock line, data flow management lines, etc.

The outgoing signal on the Tx line is supplied by an amplifier 10, commonly referred to as a "buffer", often in the form of an inverter. The incoming signal on the Rx line is processed by a logic level discriminator 12, for example a hysteresis comparator or "Schmitt-trigger". The elements 10 and of the interface are adapted to the specifications of the communication standard used. A standard usually specifies a peak to peak voltage for the signals and operating frequencies. The voltage values are provided with a margin of tolerance.

The local interface IF1 is supplied between a ground Vss1 and a voltage Vdd1 while the remote interface IF2 is supplied between a ground Vss2 and a voltage Vdd2. The grounds Vss1 and Vss2 are generally set at the same level through the ground line, not shown, of the serial link. The supply voltages Vdd1 and Vdd2 may be different.

In many cases, the two interfaces IF1 and IF2 are designed specifically to use the same communication protocol. If the voltages Vdd1 and Vdd2 do not correspond to the voltage level required by the protocol, the interfaces may integrate voltage regulators that supply elements 10 and 12 of the interfaces with the required voltage level. Thus, each inverter 10 supplies a logic signal having the required amplitude, even if the signal at its input has a different amplitude, and each discriminator 12 sets its triggering points at the same levels, so that homologous interfaces behave consistently with each other, and comply if necessary with the standard used.

The consistency of the homologous interfaces depends on how well the power levels of these interfaces match. Although standards recommend voltage levels with a margin of tolerance, satisfying these margins is not always guaranteed.

It is thus desired that homologue interfaces operate together satisfactorily even if the supply voltages of the interfaces vary by an unknown factor. U.S. Pat. No. 8,698,543 and patent application EP 1231563 offer solutions satisfying this need.

FIG. 2 shows a local interface IF1, as described in patent application EP 1231563, able to automatically adapt to the operating conditions of the remote interface IF2.

The interface IF1 comprises elements of a conventional interface, such as an amplifier or inverter 10 providing the output signal Tx and the logic level discriminator 12 processing the incoming signal Rx.

The interface IF1 further comprises a peak detector 14 connected to store the peak level of the input signal Rx. The peak level Vdd2' established by the circuit 14 is replicated by a low impedance voltage follower 16. The output of the follower supplies the high sides of elements 10 and 12 of the interface, the low sides being powered by the ground line Vss1.

With this configuration, when the input signal Rx has a high level, which corresponds in principle to the power level Vdd2 of the remote interface IF2, the elements 14 and 16 establish the supply voltage of the elements 10 and 12 to this same level or a level close thereto, noted Vdd2'. Thus, the comparison thresholds of the discriminator 12 naturally establish to values adapted to the input signal Rx, and the inverter 10 produces an output signal Tx having an amplitude suiting the remote interface. This operation is obtained irrespective of the supply voltage of the remote interface or the amplitude of the input signal Rx. It follows that the local interface automatically adapts to the power supply level of the remote interface.

In some applications, especially if the interfaces do not need to be fast, the inverter 10 is a single N-channel MOS transistor connected in "open drain". In other words, this transistor is not supplied from the high side (Vdd2') of the local interface. Instead, the remote interface includes a so-called pull-up resistor, which connects the Tx line to supply line Vdd2.

The peak detector used in these circuits generally comprises an RC circuit and a diode, elements that may occupy significant surface area in certain applications.

SUMMARY

A communication interface is provided, comprising an input terminal configured to receive a logic signal from a remote interface; a logic level discriminator coupled to the input terminal; a peak detector connected for storing the peak level of the signal on the input terminal; and a voltage follower connected to the discriminator for providing an auxiliary supply voltage based on the value provided by the peak detector. The interface further includes an electrostatic discharge (ESD) protection device, comprising a first diode and an RC circuit forming the peak detector, connected in series between the input terminal and a first power supply line; a transistor connected between the first power supply line and the input terminal by the first diode or a second diode; and an inverter configured to turn on the transistor when a voltage on the capacitor of the RC circuit is less than a threshold. The interface may further include an output terminal designed to provide an outgoing logic signal to the remote interface; and an amplifier connected to control the output terminal from the auxiliary supply voltage.

The interface may include a diode-stack connected across the capacitor.

The interface may further include a voltage elevator configured to supply the voltage follower with a voltage higher than the supply voltage of the interface.

The interface may include a switchable attenuator connected between the input terminal and the discriminator; and a comparator connected to switch the attenuator into the circuit when the supply voltage of the interface is less than the peak value supplied by the peak detector.

BRIEF DESCRIPTION OF THE DRAWINGS

Other advantages and features will become more clearly apparent from the following description of particular embodiments of the invention provided for exemplary purposes only and represented in the appended drawings, in which.

DETAILED DESCRIPTION

Figure 1:
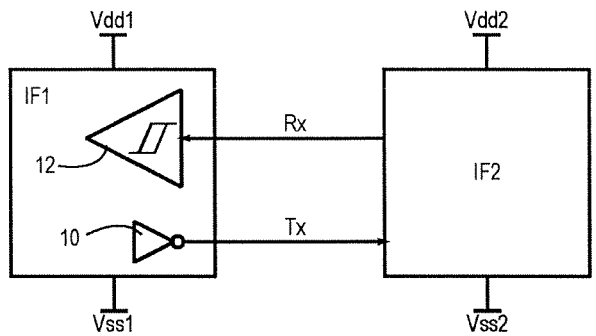
FIG. 1, previously described, schematically shows a configuration where two interfaces are connected by a bidirectional serial link.
Figure 2:
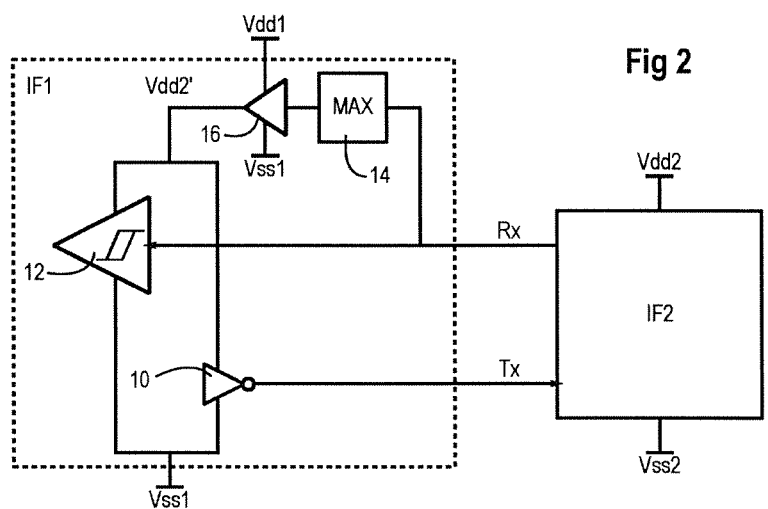
FIG. 2, previously described, schematically shows a local interface capable of automatically adapting to the voltage level of a serial signal provided by a remote interface.
Figure 3:
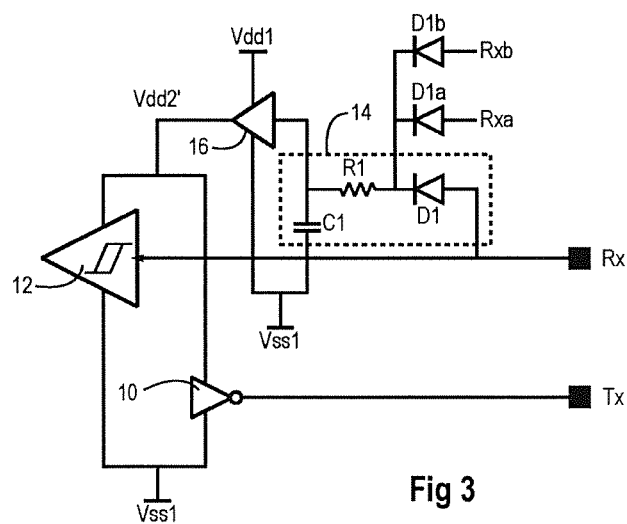
FIG. 3 illustrates an example of a peak detector usable in the local interface of FIG. 2.

FIG. 3 shows an example of a peak detector 14 usable in the local interface IF1 of FIG. 2. This detector comprises an RC circuit based on a capacitor C1 and a resistor R1 connected in series. The peak value supplied to the follower 16 is taken from the connection point between the resistor and the capacitor. The capacitor C1 is also connected to the ground line Vss1. The resistor R1 is also connected to a connection pad of line Rx by a diode D1, such that the diode is forward-biased by positive values of the Rx signal with respect to the ground Vss1.

With this configuration, the capacitor C1 charges to the peak value of Rx signal less the threshold voltage of diode D1. When the level of signal Rx decreases, the diode D1 becomes unbiased, so that the capacitor C1 maintains the maximum voltage reached.

Thus, the level supplied by the peak detector 14 differs from the supply level Vdd2 of the remote interface by a diode threshold. The threshold of diode D1 being determinable locally, the follower 16 may be designed to compensate it, or the elements 10 and 12 may be designed to account for the threshold. The peak detector 14 and the follower 16 of FIG. 3 may be shared by several interfaces realized on the same circuit, when these interfaces use substantially the same amplitude for their input/output signals. For this purpose, as shown for two additional input signals Rxa and Rxb, each input signal is applied to the anode of a respective diode D1a, D1b. The cathodes of these diodes are connected to the same resistor R1. The elements 10 and 12 of each interface are then powered by the same follower 16.

The peak detector 14 exhibits a certain impedance on the Rx line. It is desirable that this impedance does not affect the characteristics of the Rx line. For this purpose, the resistor R1 may be selected with a relatively high value and/or the capacitor C1 selected with a relatively low value. The resistance and capacitance values may be chosen to satisfy a sufficiently fast charging of the capacitor to the peak value, a sufficiently high impedance to not affect the characteristics of the Rx line, and maintaining the charge of the capacitor while the Rx signal is at a low level awaiting the next high level. If the constraints discussed above for the choice of the capacitance and resistance values are difficult to meet in some cases, another peak detector structure may be used, an example of which is presented later.

Anyway, the diode and RC-circuit structure of FIG. 3 may be part of an ESD protection device originally provided in the interface, and therefore occupy no additional surface area.

Figure 4:
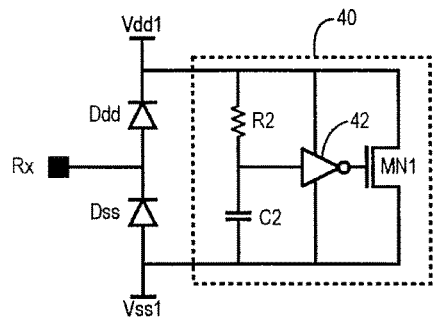
FIG. 4 schematically illustrates an example of an ESD protection device for an integrated circuit pad.

FIG. 4 schematically shows an exemplary ESD protection device that may be used in a communication interface. Each pad of the circuit, like the pad dedicated to the input signal Rx, may be connected to the supply lines Vdd1, Vss1 by respective diodes Ddd, Dss connected in reverse-bias. A protection cell 40 includes an N-channel MOS transistor MN1 connected to short-circuit the supply lines Vdd1 and Vss1. The gate of transistor MN1 is controlled by an inverter 42. The inverter 42 is controlled by the midpoint of an RC-circuit based on a capacitor C2 connected to the ground Vss1 and a resistor R2 connected to the power supply line Vdd1.

In practice, several protection cells 40 are distributed in the circuit to be protected to share the absorption of discharges. Often one cell 40 is placed near each pad of the circuit.

When the pads of the circuit are in the air, an ESD pulse occurring between any two pads is rectified by the corresponding diodes Ddd, Dss and applied to the supply lines Vdd1 and Vss1. Capacitor C2 is initially discharged and the voltage across its terminals is zero. The inverter 42, which is supplied by the ESD pulse, sees a logic 0 at its input and applies a logic 1 to the gate of transistor MN1. Transistor MN1 is turned on and tends to short-circuit the lines Vdd1 and Vss1. Transistor MN1 absorbs the discharge current and opposes to an increase in the voltage level between the lines Vdd1 and Vss1. The time constant of the RC-circuit is chosen so that the pulse does not have time to charge the capacitor C2 to a level sufficient to switch the inverter 42.

When the circuit is powered-up normally, the voltage applied between the lines Vdd1 and Vss1 is constant and ends up charging the capacitor C2. Inverter 42 then sees a logic 1 and turns off the transistor MN1.

In practice, the rise time of the supply voltage is much longer than the rise time of an ESD pulse. The RC-circuit time constant may be selected fast enough so that the voltage across the capacitor C2 keeps pace with the supply voltage while always remaining above the switching threshold of inverter 42. In this case, the inverter 42 does not turn on the transistor MN1 during power-up and the transistor does not derive any current.

Figure 5:
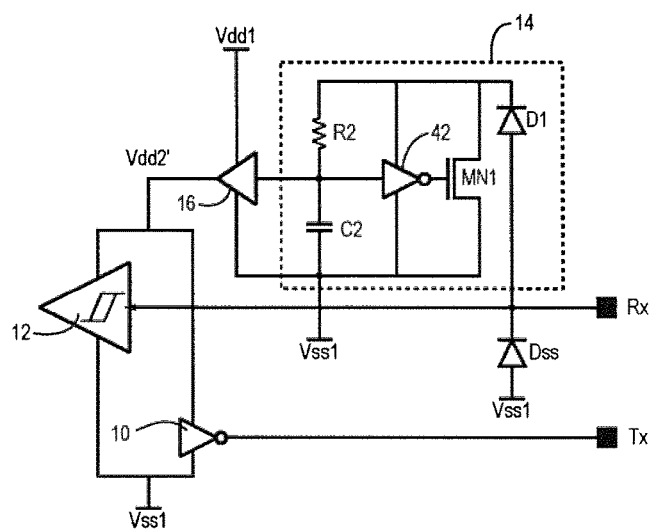
FIG. 5 illustrates an embodiment of a local interface using the protection device of FIG. 4 to achieve a peak detector.

FIG. 5 illustrates an integration of the protection device of FIG. 4 in a peak detector of the interface of FIG. 3. This configuration shares the RC-circuit of the peak detector with the protection device, and therefore does not occupy additional silicon area to implement the RC-circuit.

The protection cell 40 of FIG. 4 is reproduced in FIG. 5. However, the cell is no longer connected to the supply line Vdd1. Instead, the cell is supplied by the diode D1 of the peak detector of FIG. 3, which replaces diode Ddd of FIG. 4. The RC-circuit R2/C2 plays the same role as the RC-circuit of the peak detector of FIG. 3. Thus, the middle point is connected to the input of the follower 16.

The protection device still plays its role when the pads of the circuit are in the air. A pulse applied between the Rx pad and ground Vss1 crosses the protection device as it would in the case of FIG. 4, through the diode D1 and transistor MN1. In fact the protection device is no longer shared with peer devices—it may be common to the Rx and Tx pads.

During normal power-up, the protection device is not connected to the supply line Vdd1, and capacitor C2 remains discharged. The capacitor charges when the pad Rx receives an incoming signal. The incoming signal also has a slow rise time with respect to an electrostatic discharge. It follows that the transistor MN1 remains off, and does not affect the evolution of the incoming signal. For example, as part of the I2C or ISO-7816 standard, the RC time constant may be 834 ns, with R2=657 kOhm and C2=1.27 pF.

Figure 6:
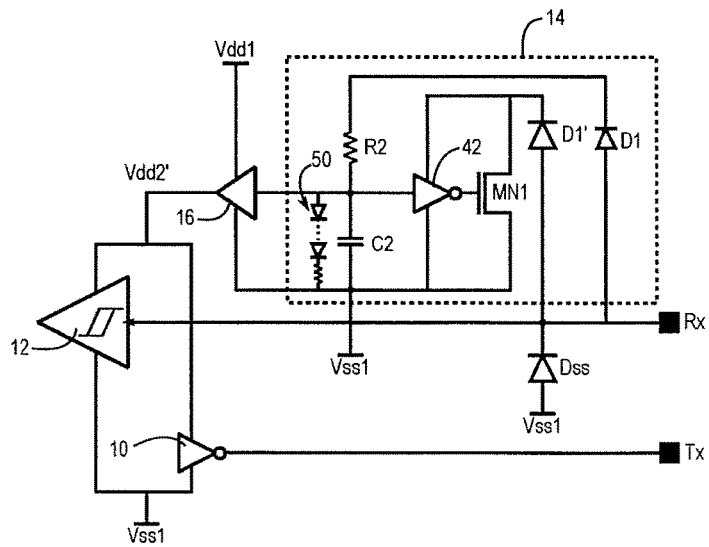
FIG. 6 illustrates an alternative of the local interface of FIG. 5.

FIG. 6 shows an alternative of the interface of FIG. 5. The RC-circuit and the diode D1 are decoupled from the rest of the protection device. The rest of the protection device is connected to the Rx pad by an independent diode D1'. With this configuration, while preserving the same operation as the circuit of FIG. 5, the diode D1 may be significantly smaller than the diode D1'. Indeed, the diode D1 no longer sees a large current during ESD, since the discharge current is directed through the diode D1'. This increases the impedance of the diode D1 and thus reduces the effect of the peak detector on the input signal Rx.

FIG. 6 further shows a voltage limiter 50 connected across the capacitor C2. A role of the limiter 50 is to protect the capacitor C2, the inverter 42 and the follower 16 from voltage surges that may be applied to pad Rx. The element 50 comprises, for example, a stack of diodes whose cathodes are oriented to ground Vdd1. This stack defines the limit voltage as the sum of the junction voltages of the diodes.

If one considers the circuit diagrams in theory, there is no discharge path of the capacitor C2 when the voltage at its terminals is lower than that set by the limiter 50. It is desirable that the capacitor discharges. In practice, the capacitor C2 is discharged by leakage currents inherent to the manufacturing technology. The discharge rate is difficult to control in this situation. It is not desirable to use a high-value resistor across the capacitor because it would occupy significant surface area. In fact the stack 50 provides a slow discharge means controllable by the leakage currents of the forward-biased junctions of the diodes. The stack may be supplemented by a reasonable value series resistor, as shown, if the discharge rate through the diodes is too fast.

The embodiments which have just been described are directed to a peak detector whose structure, based on an RC-circuit and a diode, may be shared with other elements. As previously mentioned, this structure may not be suitable in all situations, because of the voltage drop produced across the diode and the impedance presented by the structure on the Rx line.

Figure 7:
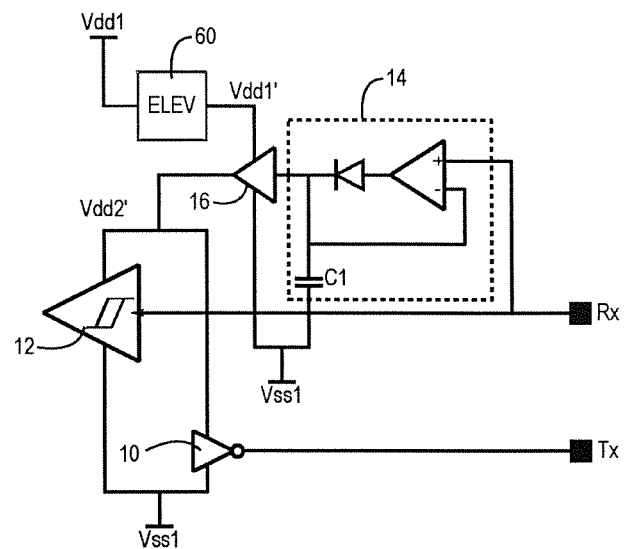
FIG. 7 illustrates an alternative of the local interface of FIG. 2.

FIG. 7 shows an embodiment of an auto-adaptive interface with an alternative of a peak detector that may avoid these difficulties. The peak detector 14 is based on an operational amplifier connected as a half-wave rectifier, followed by capacitor C1. Such a peak detector has a high input impedance and copies the peak voltage without voltage drop.

Furthermore, in order to supply the elements 10 and 12 by an unknown voltage Vdd2', the peak value of an external signal, it is desired to provide a voltage at least equal to Vdd2' inside the local interface. To meet all possible situations, the local interface may be designed to operate with a supply voltage Vdd1 equal to the maximum value of the voltage range used in the communication interfaces.

However, if it is nevertheless desired to power the local interface with a voltage Vdd1 in the lower values of the range, a voltage elevator circuit 60 may be provided, for example a charge pump, which supplies the follower 16 and the active elements of the peak detector 14 with a voltage Vdd1' greater than the expected peak value of the incoming signal.

Interfaces using open drain outputs, as previously mentioned, are not constrained as to the signal amplitude, if the amplitude can be adjusted by a pull-up resistor on the side of the receiver interface. In some applications, especially if the same transmission line is connected to the inputs of multiple interfaces, a single pull-up resistor is provided for the line, which may be a resistor external to the interfaces, connected to a voltage level independent of the interfaces. This independent voltage level, which will be designated by Vdd2 in this context, may be greater than the supply voltage Vdd1 of the local interface in question.

Figure 8:
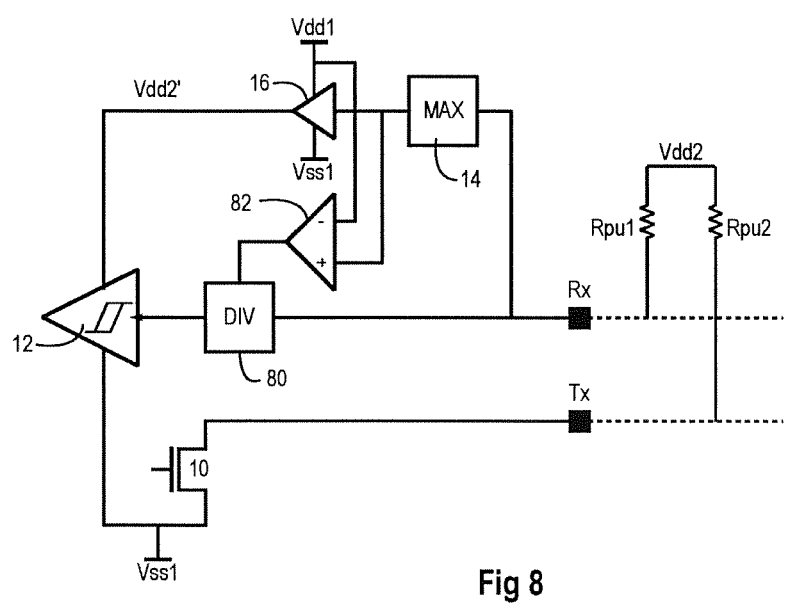
FIG. 8 illustrates another alternative of the local interface of FIG. 2.

FIG. 8 illustrates an embodiment of an interface coping with this situation without using the voltage elevator 60 of FIG. 7. The output amplifier 10 includes a transistor connected to the pad Tx in an open drain mode. It is assumed that each of lines Rx and Tx is connected externally to a voltage level Vdd2 by a respective pull-up resistor Rpu1 and Rpu2.

If the voltage Vdd2 is greater than the supply level Vdd1 of the local interface, the discriminator 12 may, in some cases, no longer detect a low logic level in the input signal Rx, especially when the signal Rx is at the limits tolerated by the standards to represent a logic low.

To avoid this situation, the Rx pad is connected to the input of the discriminator 12 through a switchable attenuator 80. A comparator 82 is connected to control the attenuator 80 according to the difference between the peak level recorded by the detector 14 and the local supply voltage Vdd1.

If the peak level is less than the voltage Vdd1, the attenuator 80 is controlled to apply no attenuation. The discriminator 12 is supplied by a voltage Vdd2 corresponding to the stored peak value, as in the case of FIG. 2.

If the peak voltage is higher than the voltage Vdd1, the follower 16 saturates and supplies the discriminator 12 at the voltage Vdd1. The attenuator 80 is then controlled to apply a voltage division. The attenuation value is preferably equal to Vdd1/Vdd2, for the nominal amplitude of the incoming signal to be reduced to Vdd1 without distortion. However, the value Vdd2 is not known in advance. The amount of attenuation may be selected to an average value taking into account the discrete possibilities of voltages Vdd1 and Vdd2. The attenuation need not be accurate it shall be sufficient to enable the discriminator 12 to detect a low logic level in the input signal within the margins tolerated by the standards.

An auto-adaptive interface of the type described herein may be particularly useful in a context where several integrated circuits mounted on a PCB or motherboard communicate via serial interfaces. In such a case, a "master" system is often provided that has multiple interfaces to communicate in parallel with several slave circuits. The interfaces of the master circuit may then be auto-adaptive, while the interfaces of slave circuits may be conventional and sometimes not controlled by the manufacturer of the master circuit.

What is claimed is:
1. A communication interface, comprising:
an input terminal (Rx) for receiving a logic signal from a remote interface (IF2);
a logic level discriminator coupled to the input terminal;

a peak detector connected to store the peak value of the signal at the input terminal; and a voltage follower connected to the discriminator for providing an auxiliary supply voltage (Vdd2') based on the value provided by the peak detector;

an electrostatic discharge (ESD) protection device, including:

a first diode (D1) and an RC-circuit configured as the peak detector, connected in series between the input terminal (Rx) and a first power supply line (Vss1);

a transistor (MN1) connected between the first power supply line (Vss1) and the input terminal (Rx) through the first diode (D1) or a second diode (D1'); and inverter configured to turn on the transistor when the voltage across the capacitor of the RC-circuit is less than a threshold.

2. The interface of claim 1, further comprising:
an output terminal (Tx) designed to provide a logical outgoing signal to the remote interface (IF2); and
an amplifier connected to control the output terminal from the auxiliary supply voltage.

3. The interface of claim 1, comprising a stack of diodes connected across the capacitor.

4. The interface of claim 1 comprising:
a switchable attenuator connected between the input terminal (Rx) and the discriminator; and
a comparator connected to switch the attenuator into the circuit when the supply voltage (Vdd1) of the interface is less than the peak value supplied by the peak detector (Vdd2).

5. The interface of claim 1, further comprising a voltage elevator configured to supply the voltage follower at a voltage (Vdd1') greater than the supply voltage of the interface.

* * * * *